United States Patent
Thuriés et al.

(10) Patent No.: US 11,018,635 B2
(45) Date of Patent: May 25, 2021

(54) EMBEDDED TEST CIRCUITRY AND METHOD THEREFOR

(71) Applicant: NXP USA, INC., Austin, TX (US)

(72) Inventors: Stephane Thuriés, Saubens (FR);
Birama Goumballa, Larra (FR);
Cristian Pavao Moreira, Frouzins (FR)

(73) Assignee: NXP USA, INC., Austin, TX (US)

(*) Notice: Subject to any disclaimer, the term of this patent is extended or adjusted under 35 U.S.C. 154(b) by 132 days.

(21) Appl. No.: 16/522,714

(22) Filed: Jul. 26, 2019

(65) Prior Publication Data

US 2020/0059203 A1  Feb. 20, 2020

(30) Foreign Application Priority Data

Aug. 14, 2018  (EP) ..................................... 18306116

(51) Int. Cl.
*G01R 31/28* (2006.01)
*H03F 1/52* (2006.01)
(Continued)

(52) U.S. Cl.
CPC ........... *H03F 1/52* (2013.01); *G01R 31/2884* (2013.01); *H03F 3/213* (2013.01); *H03F 3/4508* (2013.01);
(Continued)

(58) Field of Classification Search
CPC .............................. G01R 31/2884; H03F 1/52
See application file for complete search history.

(56) References Cited

U.S. PATENT DOCUMENTS 3,982,158 A * 9/1976 Knauer ............... H02H 3/025
361/87
4,577,149 A * 3/1986 Zbinden ............... G01R 31/50
324/72.5
(Continued)

FOREIGN PATENT DOCUMENTS

CN       104698366 A    6/2015
JP          2903946 B2    6/1999
(Continued)

OTHER PUBLICATIONS

Knapp, H., "Three-Channel 77 GHz Automotive Radar Transmitter in Plastic Package", Radio Frequency Integrated Circuits Symposium, IEEE 2012.

*Primary Examiner* — Patricia T Nguyen (57) ABSTRACT

A circuit (200) for testing failure of a connection between a radio frequency, RF, integrated circuit (201) and external circuitry (204), the circuit comprising: an amplifier (205) having first and second input paths (215, 216) and first and second output paths (206, 207); a first power detector (208, 209) coupled to one of said first or second output paths; at least one connection (211) between said first and second output paths (206, 207) and said external circuitry (204), connecting said outputs to a RF combiner (210) said external circuitry; at least one disabling circuit (230, 232, 234, 236, 240, 242, 260, 262) coupled to at least one of said first and second output paths (206, 207) or at least one of said first and second input path (215, 216), before said path reaches said power detector (208, 209); for disabling one of said inputs or outputs; wherein when said input or output path is disabled (206, 207), and a signal is output along the enabled output path (206, 207), the power detector (208, 209) on said disabled output path can detect if there is a failure in said at least one connection (211).

19 Claims, 9 Drawing Sheets

(51) Int. Cl.
*H03F 3/213* (2006.01)
*H03F 3/45* (2006.01)

(52) U.S. Cl.
CPC .... *H03F 2200/09* (2013.01); *H03F 2200/222* (2013.01); *H03F 2200/387* (2013.01); *H03F 2200/426* (2013.01); *H03F 2200/451* (2013.01); *H03F 2200/465* (2013.01); *H03F 2203/45374* (2013.01)

(56) References Cited

U.S. PATENT DOCUMENTS

| | | | | |
|---|---|---|---|---|
| 7,378,853 | B2* | 5/2008 | Hsu | H04B 3/46 |
| | | | | 324/543 |
| 9,194,884 | B1* | 11/2015 | Mossman | H03F 3/45076 |
| 9,435,842 | B2 | 9/2016 | Vaucher et al. | |
| 2007/0115005 | A1* | 5/2007 | Shimizu | G01R 31/2829 |
| | | | | 324/549 |
| 2008/0144243 | A1* | 6/2008 | Mariani | G01R 31/71 |
| | | | | 361/56 |
| 2010/0271039 | A1* | 10/2010 | Durston | H04M 3/306 |
| | | | | 324/533 |
| 2010/0328542 | A1* | 12/2010 | Kammula | H04N 21/4382 |
| | | | | 348/725 |
| 2015/0155213 | A1 | 6/2015 | Guo | |
| 2016/0204881 | A1 | 7/2016 | Chung et al. | |
| 2016/0276990 | A1* | 9/2016 | Aoyama | H03F 3/45475 |

FOREIGN PATENT DOCUMENTS

| | | | |
|---|---|---|---|
| JP | 2001142793 A | 5/2001 | |
| JP | 2018031675 A | 3/2018 | |

\* cited by examiner

Figure 15

EMBEDDED TEST CIRCUITRY AND METHOD THEREFOR

CROSS-REFERENCE TO RELATED APPLICATIONS

This application claims the priority under 35 U.S.C. § 119 of European Patent application no. 18306116.7, filed on 14 Aug. 2018, the contents of which are incorporated by reference herein.

FIELD OF THE INVENTION

The field of this invention relates to circuitry and a method for the detection of failure in integrated circuit bonds, such as ball bonds in an integrated circuit device.

BACKGROUND OF THE INVENTION

In applications such as automotive radar, safety is a key requirement of the system. A non-functioning radar could lead to catastrophic accidents. One of the possible failures is a package ball and/or solder joint break. If there is a breakage, this needs to be detected so that a decision can be taken on whether or not to disable the overall system. An example of a system where fault detection capability is important is a car-radar module used as part of an autonomous emergency braking system. Such a system detects if the vehicle is on a collision course with another vehicle or a pedestrian, and emits an early warning to the driver, and may also apply the brakes if the driver does not react. This is clearly a safety critical system, and erroneous decisions may have severe consequences, both for fail negative and false positive situations.

In a radar device, the radio frequency (RF) chip is provided in a semiconductor die, that is connected to external circuitry via ball bonds or other connectors. The radar device will have a transceiver.

Figure 2:
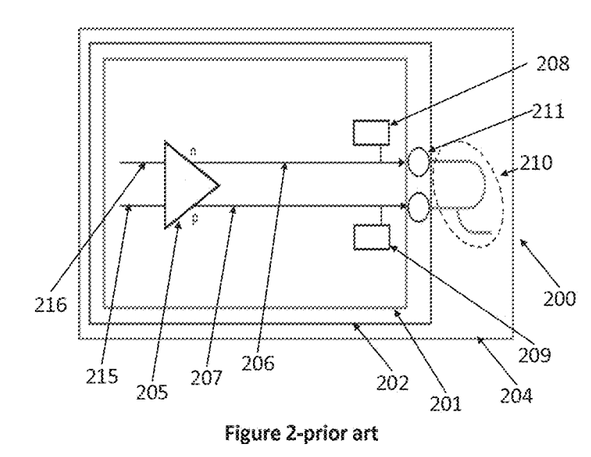
FIG. 2 illustrates an example prior art transmitter used in a radar device.
Figure 3:
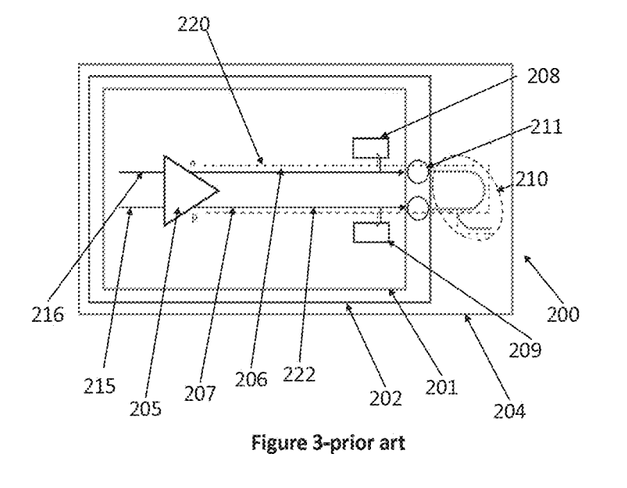
FIG. 3 is an example of the signal path in standard operating mode of the transmitter of FIG. 2

FIG. 2 shows a prior art differential transceiver 200, this consists of an integrated circuit 201, a package 202 and a printed circuit board (PCB) 204 that is used in a radar device. The integrated circuit 201 is provided with a differential power amplifier 205, with first and second differential output paths (n) 206, and (p) 207, and first and second input paths 215, 216. Each of the differential output paths 206, 207 is connected to a power detector (PDn & PDp) 208, 209. In this example embodiment of the transceiver 200, as described, the power detectors 208, 209 are directly connected to the output paths 206, 207 of the power amplifier 205. In this example, it is envisaged that any kind of coupling technique may be used (e.g. capacitive/resistive coupling, directional coupler, etc.). The definition of a package 202 is anything that can be used to connect the integrated circuit 201 to the PCB 204. At very high frequencies, such as above 40 GHz (e.g. for some radar applications) the preferred types of package are redistributed chip packaging (RCP), WLCSP (wafer level chip scale package) (as shown in FIG. 3), Ball grid array (BGA), Embedded Wafer Level Ball Grid Array (EWLB). At lower frequency, Quad Flat No-leads (QFN) types of packages are preferred. However, it is envisaged that the concepts described in this document is applicable to any type of package. PCB 204 allows the integrated circuit 201 to be connected to the other parts of the system like antenna, power management, microcontroller, through the ball bond connects 211 on the package 202. An RF combiner such as a balanced-unbalanced transformer (balun) 210 is provided on the PCB 204.

FIG. 3 shows the standard operating mode of the radar device. Differential power amplifier 205 and package 202 interconnections are often used at high frequency because this allows more power from the power amplifier 205 and less losses in the package 202. In operation, signals are received at the power amplifier 205 on input paths 215, 216, and differential signal are provided from the power amplifier 205 on the output paths 206, 207. These differential signals have to be converted into a single signal that is then sent to an antenna (not shown). An RF combiner 210 is used to produce the single signal that is sent onto the antenna the RF combiner can be a discrete component (to operate at low frequency, typically 1 MHz to 5 GHz) or alternatively may be a microstrip design (to operate at high frequency above, say, 1 GHz). This is an overlap where both types of implementation are possible.

The connection from the circuit components to a printed circuit board, for example through the ball bonds 211, can be subject to mechanical strain that may be due to differences in the thermal expansion coefficients of the circuit and board material. This can lead to ball breakages after a number of temperature cycles, that are relatively common in automotive environments. When there is a failure in the ball bond that connects to the output of the radar chip to the external circuitry, the radar can no longer emit the RF and there is a system failure. In order to be compliant with ISO26262, this failure must be detected to be able to place the device in a fail-safe-state. Other relevant standards include RTCA DO-254/Eurocae ED-80.

Detecting a RF ball break is complex because a partially broken ball can still have a correct DC behaviour but not a correct RF behaviour. A ball can be partially broken resulting in an increase of the inductance of the connection. Then, at low frequency (down to DC) the inductance is neglectable and the connection is still working. At High frequency the inductance act as an open and the signal is blocked. Defining what is high or low frequency is complex because it depends on the ball size, package type, acceptable losses. Then the detection must be done at the frequency of interest (ie 76 to 81 GHz for automotive radar). This issue may also arise for other connection methodologies between different components in a package and the invention should be understood accordingly.

SUMMARY OF THE INVENTION

Examples of the present invention provide circuitry and a method for detecting a connection failure, as described in the accompanying claims. Specific embodiments of the invention are set forth in the dependent claims. These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated example embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

The key elements of this invention are to provide a circuit and a method to detect failure in the package, solder joint, ball bonds or printed circuit board (PCB) of an integrated circuit element such as a differential transmitter or a quadrature transmitter. Some examples of the invention provide a mechanism to measure the power coupled from one output path of a power amplifier, passing through a circuit element, such as an RF combiner, to a power detector on another output path of the power amplifier. To perform this measurement, it is required to disable and/or disconnect one output path of the differential power amplifier, some of the possible example implementations for disabling the output path are described below:

A first example embodiment of the invention provides a disabling circuit that uses switches that are in series with the output paths of the power amplifier. The switches are used to disable one output path of the power amplifier, the power detector on the disabled output path of the amplifier is then connected to the RF combiner only. The power detector on the disabled output path can then measure the power coming from the other output path that has passed through the RF combiner and is returned to the disabled output path through a connection.

An alternative example embodiment of the invention uses switches in parallel with the power amplifier output paths and the ground, associated with Lambda/4 transmission lines in series in-between the switch and the power detector. It's then possible to disable one output path of the amplifier while still being able to use the power detector (not shorted @ RF frequencies due to Lambda/4 line).

In accordance with further example embodiments, a new method for the detection of failure in integrated circuit bonds is described that consists of avoiding signal on one output path of the power amplifier. In accordance with some example embodiments, it is envisaged that there are a lot of possible implementations that can be used to adopt the concepts herein described, some of them are: turn OFF the biasing on the output path to be disabled, turn OFF the RF signal at the input on the output path to be disabled, etc. . . . . . In accordance with some example embodiments, it is envisaged that this can be used alone or with the previous circuit implementations.

In accordance with further example embodiments, it is envisaged that—an improvement for the three previous embodiments may be to use a directional coupler to connect the power detectors to the output paths. In this manner, it allows to discriminate the signal coming from the other side from the signal reflected and/or transmitted by the disabled output path. In fact, the quality of the switch (i.e. its capability to be really open or closed) may not be sufficient at very high frequencies.

Figure 1:
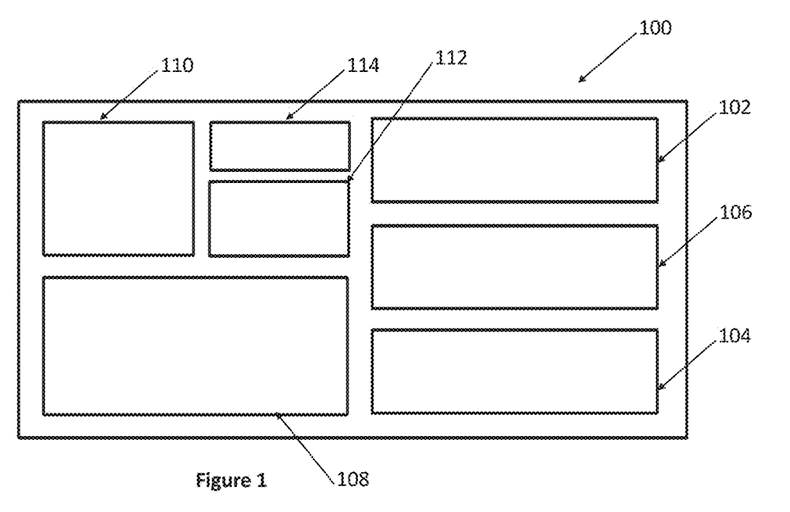
FIG. 1 illustrates a block diagram of an example radar device.
Figure 4:
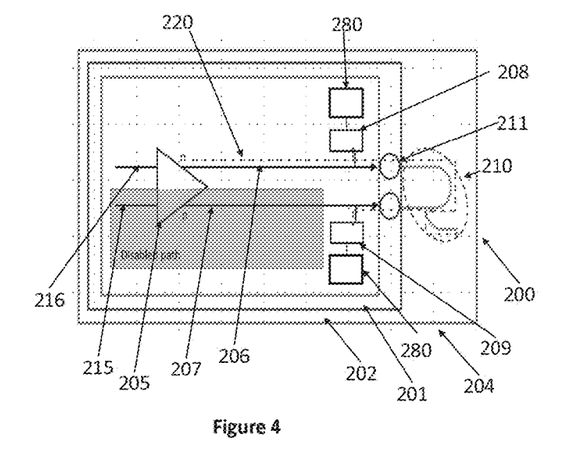
FIG. 4 illustrates an example of the radar device with one of the signal paths disabled.

FIG. 1 shows a simplified block diagram of a radar device 100 that may be used in automotive applications. The radar device has a receiver 102, transmitter 104, phase-locked loop 106, controller 108, storage unit 110. Safety unit 112 and Power Monitoring (PM_ unit 114 The radar device can incorporate the testing circuitry of this invention as describe below to test that the device is working correctly, FIG. 4 is an illustration of a transmitter 200 with the differential p side output path 207 disabled, and a portion of the signal from the power amplifier 205 being output on the differential n side output path 206 and being detected at power detector 208. The portion of the signal is then passed through package 202 to the balun 210, and will then be returned to power detector 209. If there is a failure in the package 202 and/or the PCB 204 and/or in the balun 210, the power detector 208, 209 of the disabled differential output path 206, 207 will not detect any signal. In normal operating mode, the transmitter 200 works as follows: after receiving signals along input paths 215, 216 the power amplifier 205 is enabled and provides differential signal path 220, 222 along the differential output paths n and p 206, 207. The phase difference between n and p is 180°. The differential signal on signal path 220, 222 are measured either continuously or discretely by the differential power detectors 208, 209. The method of measurement (continuous or not) has no effect on this invention. The differential signal on signal paths 220, 222 then go through the package 202 via connection 210 and are combined in the RF combiner 210 prior to further transmission to the antenna.

Examples of the invention allow the detection of a connection component failure between stacked circuitry components or other circuitry, where examples of the connection may be a ball bond or solder joint or other package connection. In an example of the invention, by 'disabling' one output path of the transmitter 202, then the power detectors 208, 209 on the disabled output path of the power amplifier 205 will be able to measure a signal coming from the other non-disabled output path of the power amplifier 205 through package 202. PCB 204 and balun 210. FIG. 4 shows the example of the differential p side output path 207 being disabled. However, it is envisaged that, the invention also covers the possibility of disabling either of the two differential output paths: n 206 or p 207 or disabling each differential output alternatively. For any failure between the differential output path 206, 207 of the amplifier 205 on one side and the power detector on the other, the disabled output side will be detected by the power detector on the disabled output side. In the context of the invention, the term 'disable' encompasses: any mechanism or effect that disables an output path of the power amplifier 205, so that the power detector 208, 209 on the disabled output path does not receive any signal from the power amplifier 205.

In an example of the invention, an output is provided along differential output path 206 (n-output) and is detected at power detector 208. This measurement is to ensure that the power amplifier 205 is working correctly. The signal is then subsequently measured at the differential power detector 209 of the disabled differential output path to check if power is present (coming from the enabled side of the power amplifier 205 through the balun transformer 210). If a signal is detected at the differential power detector 209 then there is no failure. However, if the signal is not detected, or is below a detection threshold, then there is a failure of some component of the circuit. The threshold for the detection has to be determined for each implementation, as it is generally application specific and may be trimmable for flexibility, that is the value of the threshold can be changed according to how the measurements are performed. The threshold values may also be stored in a register.

Embodiment 1

Figure 5:
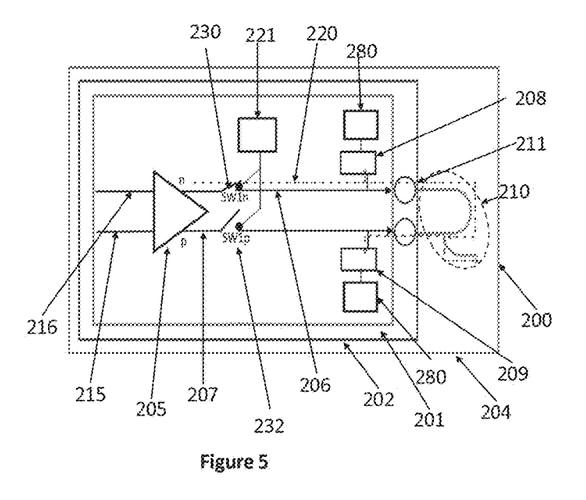
FIG. 5 illustrates a first example embodiment of the invention.

FIG. 5 shows a first example embodiment of the invention, which includes switches 230, 232 that are used to disable the output paths 206, 207. The switches are located between the power amplifier 205, and differential power detectors 208, 209 in each of the output paths 206, 207. In normal operation of the device 200 both switches 230, 232 are closed and the differential outputs 206, 207 of the power amplifier 205 are connected to the differential power detectors 208, 209. The power amplifier 205 includes an internal controller to control the power output along the output paths 206, 207. Controller 280 is connected to power detectors 208, 209, to set a defined power level at the power detector, and to control the threshold levels of the power detectors 208, 209. Disabling one of the differential output transmission lines is done by opening the switch on the output side to be disabled, and leaving the switch closed on the output side that is to remain enabled. Failure detection will occur in the manner as described above. Controller 221 is coupled to the disabling circuit to control the operation of the disabling circuit, in this embodiment, by controlling switches 230 and 232. The switches may be opened and closed sequentially, or in another order to ensure all the components of the circuit are tested for failure.

Figure 7:
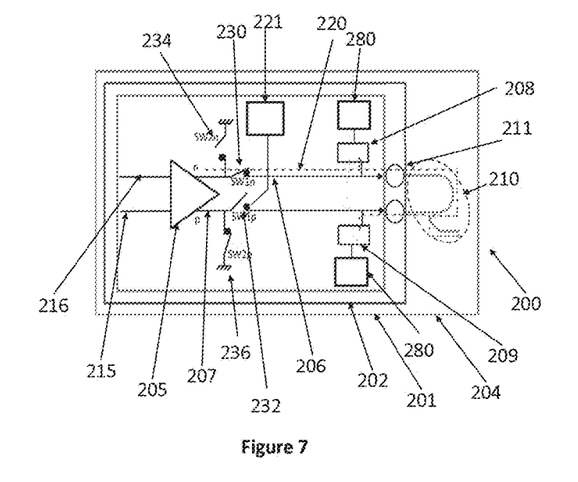
FIG. 7 illustrates a second example embodiment of the invention.
Figure 8:
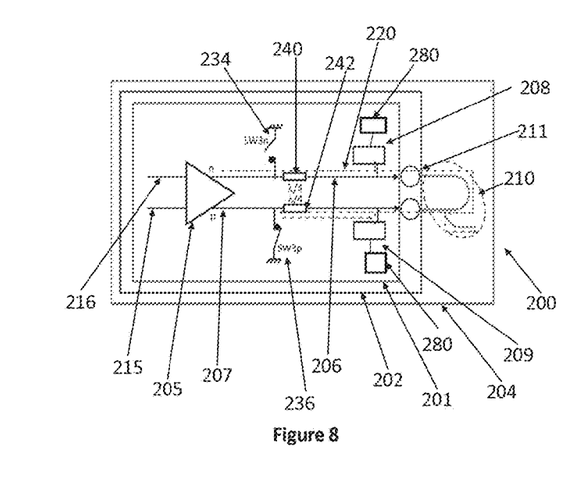
FIG. 8 illustrates a third example embodiment of the invention.

In some examples, in failure detection mode only one of the switches is closed (it can be one or the other or both sequentially, n-side in the FIG. 7 whereas the other (p-side FIG. 7. FIG. 8.) one is opened.

In this example of the invention, signal path 220 shows the path of the signal from the power amplifier 205, passing along the enabled signal path 206, through the connection component 210, that may be a ball bond or solder joint, Into balun 210 that is acting as an RF combiner, and then out of the RF combiner 210, and back through the connection component 211 to be detected at the power detector 209 of the disabled output path 207. Of course, the device may also work in another configuration, where the signal is provided on output path 207, and output path 206 is disabled. In this example, the signal when it has passed through the RF combiner 210 will be detected at power detector 208 of disabled output path 206.

Figure 6:
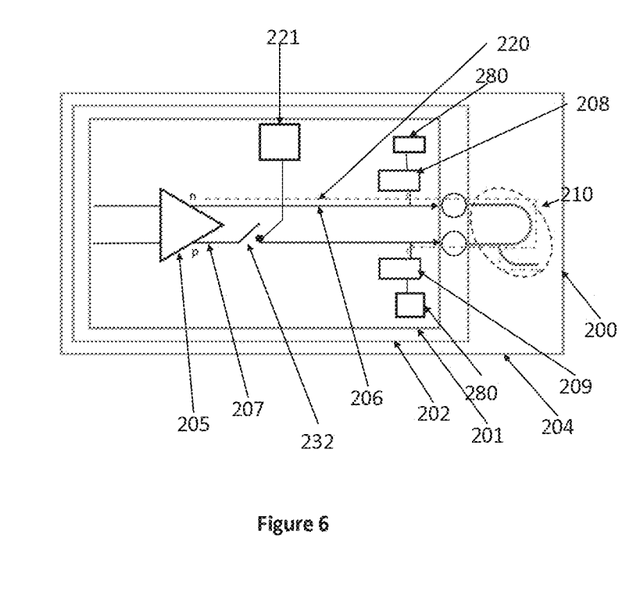
FIG. 6 illustrates a modified example of the first embodiment of the invention

As shown, the circuit includes an amplifier output disabling circuit connected to both the output paths 206, 207, but in an alternative example of the invention, the disabling circuit may be connected to only one of the output paths 206, 207, as shown in FIG. 6 which has switch 232 on output path 207, but no disabling circuitry on the other output path 206. All the other features of this circuit operate as described above with respect to FIG. 5. As shown, the disabling circuit is only on the p output path 207, and in operation of the circuit the signal path 220 is along output path 206, through balun 210, for the signal to be detected at power detector 209. In an embodiment of the invention, the disabling circuit may instead be provided on n output path 206, so the signal path is along output path 207, through balun 210, and signal detected at power detector 208 of the n output path 206.

Embodiment 2

FIG. 7 shows another example embodiment of the invention, which is based on the embodiment of FIG. 5. However, in the example embodiment of FIG. 7 the disabling circuit includes additional switches 234, 236 that are configured to tie (i.e. 'short') the disabled differential transmission line to ground in order to improve the rejection of the signal from the disabled output of the power amplifier 205. In some examples, those switches 234,236 are complementary controlled compared to switched 230, 232. In the embodiment of FIG. 3 switches 230, 232 may have the problem that when a switch is in an open state there are still some radio frequency signal leakage across the switch. Adding the switches 234, 236 to short one of the differential output transmission lines from the power amplifier 205 to ground, enables the other active differential transmission line to be measured. Like the first embodiment, in this example of the invention the disabling circuit may be provided on only one of the output paths 206, 207.

In this example of the invention, signal path 220 shows the path of the signal from the power amplifier 205, passing along the enabled signal path 206, through the connection component 210, that may be a ball bond or solder joint, into balun 210 that is acting as an RF combiner, and then out of the RF combiner 210, and back through the connection component 211 to be detected at the power detector 209 of the disabled output path 207. Of course, the device may also work in another configuration, where the signal is provided on output path 207, and output path 206 is disabled. In this example, the signal when it has passed through the RF combiner 210 will be detected at power detector 208 of disabled output path 206.

For a device that is operating at 1 GHz it's possible to implement switches 230, 232, 234, 236 such that there is little or no RF leakage. In this case embodiment 1 or 2 of the invention is the preferred embodiment.

Embodiment 3

At higher frequencies, e.g. much higher than 1 GHz, it's not possible to design switches with very low losses. In this case, having switches in series and located on the differential output paths 206,207 of the Power Amplifier 205 (as described in the embodiment of FIG. 4 above) is not practically possible. In order to overcome this issue another example circuit implementation is proposed as shown in FIG. 8. This example embodiment uses shunt switches 234, 236 that will not impact the performance of the transmitter 200 as the disabling circuit. FIG. 8 shows a third example embodiment of the invention. This example embodiment will generally operate in the manner described for the embodiment of FIG. 4 above, that is, output path 207 of the power amplifier 205 may be disabled by the disabling circuitry, by shorting this output path to ground, via switch 236. The differential output paths 206, 207 are also provided with a λ/4 transmission line 240, 242, between the power amplifier 205 and the power detectors 208, 209, on each output path 206, 207 that provide matching of the output of the PA 205 to the inputs of the power detectors 208, 209 at the frequency of interest.

For devices that operate at 77 GHz a design providing an effective and robust switch in the output path is difficult, thus embodiments 1 and 2 are less suitable. In this case, having the λ/4 transmission lines 240, 242 in the output paths 206, 207 is preferred for devices at such high frequencies.

In this example of the invention, signal path 220 shows the path of the signal from the power amplifier 205, passing along the enabled output path 206, through λ/4 transmission line 240, then through the connection component 210, that may be a ball bond, wirebond or solder joint, into balun 210 that is acting as an RF combiner, and then out of the RF combiner 210, and back through the connection component 211 to be detected at the power detector 209 of the disabled output path 207. Of course, the device may also work in another configuration, where the signal is provided on output path 207, and output path 206 is disabled. In this example, the signal when it has passed through the RF combiner 210 will be detected at power detector 208 of disabled output path 206.

Embodiment 4

Figure 9:
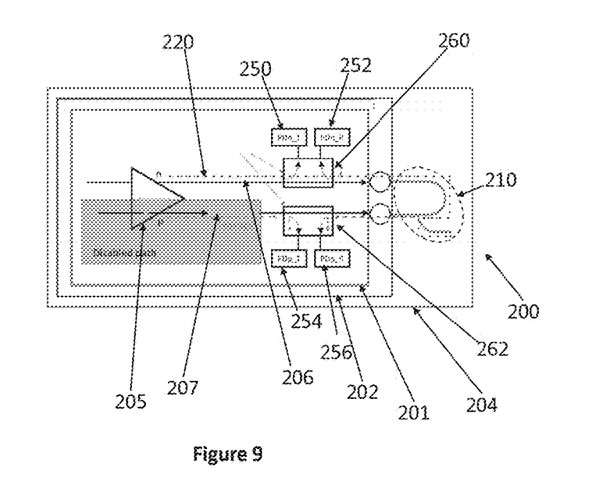
FIG. 9 illustrates a fourth example embodiment of the invention.

FIG. 9 shows a further example embodiment of the invention. In this example embodiment of the invention, each differential output path 206, 207 has two power detectors connected thereto; for example first differential output path 206 is connected to power detectors 250, 252 and second differential output path 207 is connected to power detectors 254, 256. Each of the power detectors is coupled to the output paths 206, 207 through directional couplers 260, 262. The use of directional couplers 260, 262 as the disabling circuit, rather than switches as in the previous embodiments, enables a (relatively fixed) proportion of the transmitted signal to be extracted and measured by the power detectors without being affected by unwanted signals due to, say, mismatching of the switches or RF leakage across the switches and cross-coupled to the other differential transmission line, as the unwanted leaked signals may perturbate the power detection measurement by adding unwanted power into the measuring power detector from the disabled output side.

In this example of the invention, signal path 220 shows the path of the signal from the power amplifier 205, passing along the enabled signal path 206, through the connection component 210, that may be a ball bond or solder joint, into balun 210 that is acting as an RF combiner, and then out of the RF combiner 210, and back through the connection component 211 to be detected at the power detector 256 of the disabled output path 207. Any leakage that occurs along the disabled output path 207 will be detected at power detector 252. In this way the leakage signal on the disabled path can be discriminated from the signal from the enabled output path. Of course, the device may also work in another configuration, where the signal is provided on output path 207, and output path 206 is disabled. In this example, the signal when it has passed through the RF combiner 210 will be detected at power detector 208 of disabled output path 206.

Embodiment 5

Figure 10:
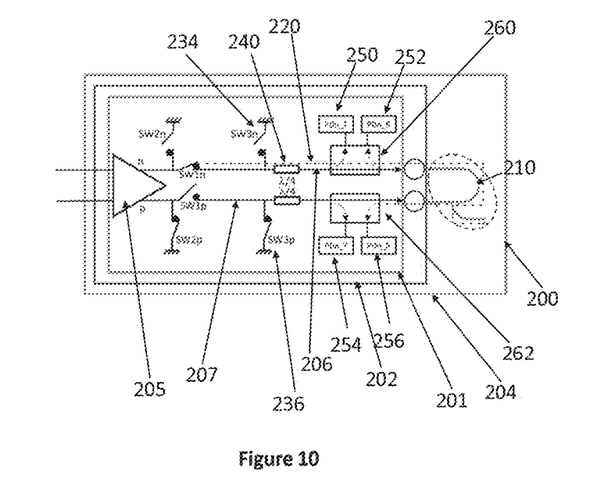
FIG. 10 illustrates a fifth example embodiment of the invention.

FIG. 10 shows a further example embodiment that is composed of all of the different components, circuits and methods of disabling an output path from the previous five embodiments. That is, in this example embodiment, the disabling circuit includes switches, 230, 232, switches 234, 236, together with the λ/4 differential transmission lines 240, 242, directional couplers 260, 262. Also, in this example embodiment of the invention each differential output path 206,207 of the power amplifier 205 has two power detectors 250, 252, 254, 256, that are coupled to the output path through a directional coupler 260, 262.

In this example of the invention, signal path 220 shows the path of the signal from the power amplifier 205, passing along the enabled output path 206, through the connection component 210, that may be a ball bond or solder joint, into balun 210 that is acting as an RF combiner, and then out of the RF combiner 210, and back through the connection component 211 to be detected at the power detectors 254, 256 of the disabled output path 207, passing to the power detectors 254, 246 via the directional coupler 262. Of course, the device may also work in another configuration, where the signal is provided on output path 207, and output path 206 is disabled. In this example, the signal when it has passed through the RF combiner 210 will be detected at power detector 208 of disabled output path 206.

Embodiment 6

In some examples, it is further envisaged that example embodiments of the invention may disable one of the Power Amplifier 205 differential output paths 206, 207 by modifying the bias of the Power Amplifier 205. It is envisaged that there are several alternative ways that this approach could be achieved, most examples of which will depend on the output stage implementation of power amplifier 205.

Figure 11:
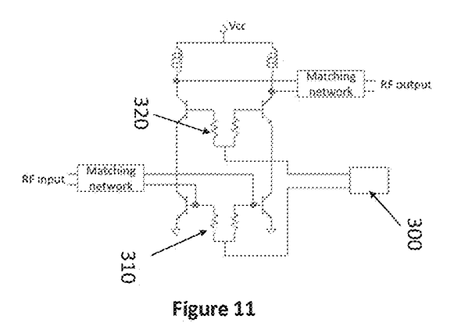
FIG. 11 illustrates a example circuit for biasing a differential amplifier.
Figure 12:
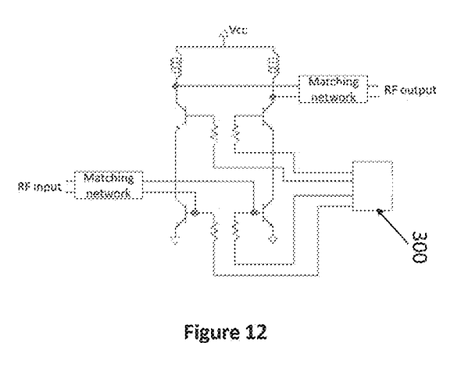
FIG. 12 illustrates an example circuit for biasing a differential amplifier according to some examples of the invention.

A standard way of biasing a differential amplifier is shown in FIG. 11, where both sides of the amplifier are biased with the same voltage. A possible modification to FIG. 11, in accordance with some examples of the invention to detect a failure in integrated circuit bonds, is to dissociate the biasing of each side of the differential outputs, as shown in FIG. 12. In this case, it becomes possible, by selective control of the respective bias supply voltages, to disable one output only of the power amplifier 205. These biasing methods are well known in the art and so will not be described in detail. FIG. 11 shows a differential amplifier using a classical biasing method. The bias block 300 generates 2 voltages, one for the gain stage 310 of the power amplifier 205 and another for the cascade stage 320). The bases of the transistors in the gain stage 310 and the cascade stage 320 are connected together so that both n and p side are biased simultaneously. FIG. 12 shows a modification of the circuit that allows each side of the power amplifier 205 to be biased independently by bias block 300, then one output path of the power amplifier 205 can be turned ON while the other output path is turned OFF (by applying 0V on the bases of the transistors) A skilled artisan will appreciate that this adaptive biasing method may affect the matching, and therefore the performance of the power amplifier 205. However, this will only be impacted when trying to detect a ball break, and not in normal operation of the device.

Embodiment 7

In yet a further example embodiment of the invention, it is envisaged that the concepts herein described to disable one side of a differential output of a transmitter path, may be to use one or more of the previous embodiments anywhere in the RF chain (e.g. before the PA).

Figure 13:
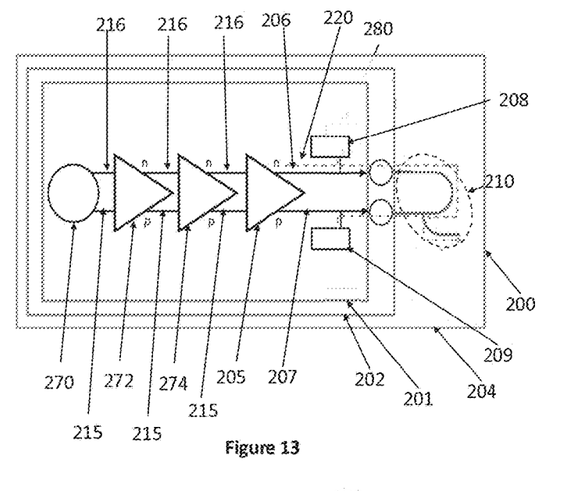
FIG. 13 illustrates a sixth example embodiment of the invention.
Figure 14:
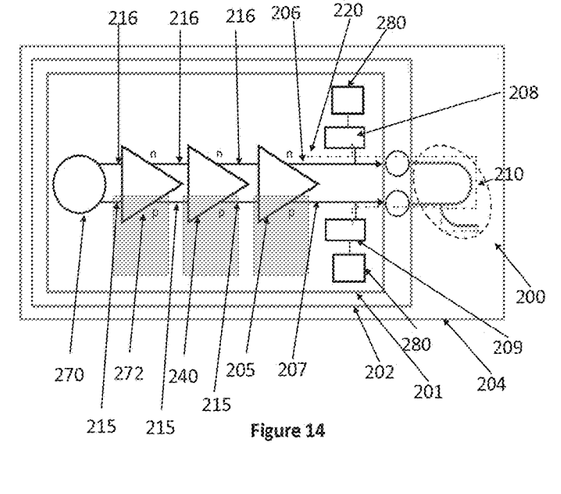
FIG. 14 is an alternative illustration of the sixth example embodiment of the invention.
Figure 15:
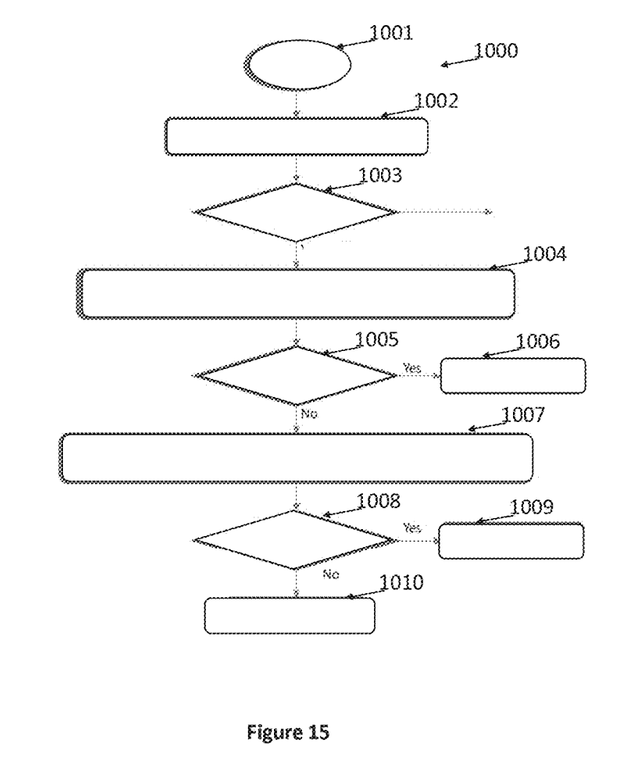
FIG. 15 is an example flow chart associated with operation of the circuitry according to the various example embodiments of the invention.

FIGS. 13 and 14 show an example embodiment of the invention where the disabling circuitry is provided on the input paths to the power amplifier 205. In this example of the invention, output from voltage controller oscillator (VCO) 270 passes along input paths 215,216 to phase shifter 272, and then along paths 215, 216 to BUF amplifier 274, before passing along path 215, 216 to the power amplifier 205 and being output from the power amplifier 205 as described for previous embodiments. As shown in FIG. 14 the p-output path 215 for phase shifter 272, BUF 274 and power amplifier 205 may be disabled. When these output paths are disabled, the signal from power amplifier will have signal path 220, from power amplifier 205, into the balun 210, to be detected at power detector 209, on the disabled path 207 of the circuit, FIG. 15 is a flow chart 1000 of the method for all of the embodiments described above. At 1001 the detection method starts. The method passes to 1002 where—the circuit is turned 'on' in a normal operation mode. At 1003 a determination is made that the power detectors on both output paths are giving the correct nominal values for standard operation, and/or that the power detectors are operating according to the specified power threshold as determined by controller 280. If the power detectors are providing the correct nominal values, the flowchart proceeds to 1004. If the detected values are not correct, there is a problem with the circuit that should be investigated. At 1004, the flowchart disables one of the output/input paths using the disabling circuitry described above, provides a signal on the enabled path, and measures the signal at the power detector of the disabled output path. At 1005 the flowchart determines if the measured power of the signal from the enabled output path side is faulty, e.g. the measured power is below a set threshold. If the measurement is below the threshold, at 1006, then a break in the contact between the integrated circuit 201 and the pcb 204 is detected and the appropriate action may be taken in response to this determination. However, if the measured value is above the set threshold, the flowchart proceeds to 1007, where the disabled/enabled paths are reversed to check that the circuit has no failures in this alternative configuration. At 1008, therefore, the flowchart measures the power from the signal from the enabled output path on the power detector for the other disabled output path. At 1009, if the determination is that the measurement is below the set threshold, a ball break or other connection problem has been detected. In this situation, again, appropriate action may be taken. However, if the measurement at 1008 is determined as being above the threshold, then at 1010 the circuit is deemed to be working correctly, with no breaks that will prevent successful operation and to the circuit can be operated in a normal manner.

According to the technology area that the radar device is to be used in then certain embodiments of the invention may be more suitable than others, For example, the first embodiment may be more suitable for low frequency RF circuits.

Although examples of the invention are described with reference to a radar unit suitable for an automotive application, it is envisaged that the concepts herein described may be applicable to other applications, such as radar for robotics or drones. Furthermore, it is envisaged that the concepts described herein will be applicable to any RF circuit or device that uses differential signalling and differential transmission lines. Alternatively, the invention may also be used for any communication device that includes an RF combiner for combining the output from two or more output paths. This may include quadrature transmitters, that have separate 'I' and 'Q' channels, instead of differential signals as described above. The transmitter will be connected to external circuitry via connections such as ball bonds or solder joints, and failure of the connection between different circuit components will be detected in the manner described above.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A circuit for testing failure of a connection between a radio frequency, RF, integrated circuit and external circuitry, the circuit comprising:
   an amplifier having first and second input paths and first and second output paths;
   a first power detector coupled to one of said first or second output paths;
   at least one connection between said first and second output paths and said external circuitry, connecting said outputs to a RF combiner said external circuitry;
   at least one disabling circuit coupled to at least one of said first and second output paths or at least one of said first and second input path, before said path reaches said power detector; for disabling one of said inputs or outputs;
   wherein when said input or output path is disabled, and a signal is output along the enabled output path, the power detector on said disabled output path can detect if there is a failure in said at least one connection.

2. A circuit according to claim 1 further comprising a second power detector coupled to the other of said first or second output paths not coupled to said first power detector.

3. A circuit according to claim 1 wherein the disabling circuit is coupled to either both input or both output paths.

4. A circuit according to claim 1 wherein said disabling circuit is at least one of: at least one in-line switch, at least one shunt switch, at least one biasing circuit, or at least one directional coupler.

5. A circuit according to claim 3 wherein said disabling circuit is a switch connected between said power amplifier and said power detector.

6. A circuit according to claim 1 further comprising at least one switchable ground connection to connect at least one of said first and second output to ground.

7. A circuit according to claim 1 further comprising a quarter wavelength transmission line between said disabling circuit and said power detector.

8. A circuit according to claim 1 wherein said disabling circuit is a directional coupler for coupling said power detectors to at least one of said first and second outputs, and each said power detector is comprised of a plurality of power detectors.

9. A circuit according to claim 1 wherein said RF combiner is a balun device or a transformer.

10. A circuit according to claim 1 wherein said connection is one or more of: at least ball bond connection, at least one wire bond at least one solder joint, or at least one package connection, and each output path is connected to said RF combiner by a separate connection.

11. A circuit according to claim 1 further comprising a controller for said amplifier output disabling circuit.

12. A circuit according to claim 1 for detecting a partial failure in said at least one connection, wherein when said signal is a DC signal no failure is detected at the power detector of said disabled output path, and when said signal is an RF signal failure is detected at the power detector of said disabled output path.

13. A method for testing a connection between a radio frequency, RF, integrated circuit and external circuitry,
   where said RF chip comprises an amplifier with a plurality of inputs and outputs,
   each output coupled to a power detector,
   and at least one amplifier output disabler connected to at least one of said first and second outputs or one of said first and second inputs, before said path reaches said power detector; for disabling one of said inputs or outputs;
   at least one connection between said first and second output paths and said external circuitry, connecting said outputs to a transformer on said external circuitry;
   wherein said method comprises the steps of:
      disabling one of said input or said output paths, and providing a signal on the output path of the amplifier that is not disabled;
      transmitting said signal from said from said output path to a transformer on the external circuitry via a connection;
   detecting said output from said transformer at the power detector of said disabled input or output path to confirm said connection has not failed.

14. A communication device comprising:
   a circuit for testing failure of a connection between a radio frequency, RF, integrated circuit and external circuitry, the circuit comprising:
      an amplifier having first and second input paths and first and second output paths;
      a first power detector coupled to one of said first or second output paths;
      at least one connection between said first and second output paths and said external circuitry, connecting said outputs to a RF combiner said external circuitry;
      at least one disabling circuit coupled to at least one of said first and second output paths or at least one of said first and second input path, before said path reaches said power detector; for disabling one of said inputs or outputs;
      wherein when said input or output path is disabled, and a signal is output along the enabled output path, the power detector on said disabled output path can detect if there is a failure in said at least one connection.

15. A device according to claim 14 wherein the circuit further comprising a second power detector coupled to the other of said first or second output paths not coupled to said first power detector.

16. A device according to claim 14 wherein the disabling circuit is coupled to either both input or both output paths.

17. A device according to claim 14 wherein said disabling circuit is at least one of: at least one in-line switch, at least one shunt switch, at least one biasing circuit, or at least one directional coupler.

18. A device according to claim 16 wherein said disabling circuit is a switch connected between said power amplifier and said power detector.

19. A device according to claim 14 wherein the circuit further comprising at least one switchable ground connection to connect at least one of said first and second output to ground.

* * * * *